United States Patent
Shoa Hassani Lashidani

(10) Patent No.: US 11,079,437 B2
(45) Date of Patent: Aug. 3, 2021

(54) BATTERY STATE-OF-HEALTH DETERMINATION UPON CHARGING USING STATE-OF-HEALTH CLASSIFIER

(71) Applicant: Cadex Electronics Inc., Richmond (CA)

(72) Inventor: Tina Shoa Hassani Lashidani, North Vanvouver (CA)

( * ) Notice: Subject to any disclaimer, the term of this patent is extended or adjusted under 35 U.S.C. 154(b) by 364 days.

(21) Appl. No.: 16/212,267

(22) Filed: Dec. 6, 2018

(65) Prior Publication Data

US 2019/0170827 A1 Jun. 6, 2019

Related U.S. Application Data

(60) Provisional application No. 62/595,543, filed on Dec. 6, 2017, provisional application No. 62/595,532, filed on Dec. 6, 2017.

(51) Int. Cl.
| | | |
|---|---|---|
| *G01R 31/36* | (2020.01) | |
| *G01R 31/3835* | (2019.01) | |
| *G01R 31/392* | (2019.01) | |
| *H02J 7/00* | (2006.01) | |
| *G01R 31/367* | (2019.01) | |

(52) U.S. Cl.
CPC ....... *G01R 31/3648* (2013.01); *G01R 31/367* (2019.01); *G01R 31/3835* (2019.01); *G01R 31/392* (2019.01); *H02J 7/0068* (2013.01)

(58) Field of Classification Search
CPC .................................................. G01R 31/3648
USPC ......................................................... 702/63
See application file for complete search history.

(56) References Cited

U.S. PATENT DOCUMENTS

| | | | |
|---|---|---|---|
| 6,534,954 B1 | 3/2003 | Plett | |
| 8,258,751 B2 | 9/2012 | Esnard | |
| 8,332,169 B2 | 12/2012 | Kang | |
| 8,564,242 B2 | 10/2013 | Hansford | |
| 9,081,068 B2 | 7/2015 | Mattisson | |
| 9,170,305 B2 | 10/2015 | Gu | |
| 2007/0299620 A1* | 12/2007 | Yun | G01R 31/3842 702/63 |
| 2008/0197807 A1 | 8/2008 | Simopoulos | |
| 2011/0060538 A1 | 3/2011 | Fahimi | |
| 2012/0316814 A1 | 12/2012 | Rahaman | |
| 2013/0110429 A1* | 5/2013 | Mitsuyama | G01R 31/367 702/63 |
| 2013/0138369 A1 | 5/2013 | Papana | |

(Continued)

OTHER PUBLICATIONS

Ryan Ahmed, Modeling and State of Charge Estimation of Electric Vehicle Batteries (abstract); MacSphere; 2014, pp. 1-2; McMaster University.

(Continued)

*Primary Examiner* — Ricky Go

(57) ABSTRACT

A rechargeable battery is charged and, at the same time, steps are taken to assess its state of health (SoH). The SoH is first broadly classified, which is only a coarse estimate. Next, the state of charge (SoC) is estimated, and then the SoC is repeatedly measured and predicted during charging until its value converges to a reliable value. The SoH is a state in the Kalman filter used for determining the SoC, and the SoH is also refined through the filter process. The SoH is reported when or after the SoC has converged, and is reported before charging is completed.

20 Claims, 6 Drawing Sheets

(56) References Cited

U.S. PATENT DOCUMENTS

2015/0377974 A1* 12/2015 Choi .................... G01R 31/367
                                                        702/63
2019/0036356 A1*  1/2019 Subbaraman ......... H02J 7/0021
2020/0164763 A1*  5/2020 Holme ................... B60L 58/10

OTHER PUBLICATIONS

Taesic Kim, State of charge estimation based on a realtime battery model and iterative smooth variable structure filter; May 20-23, 2014; pp. 132-137; Innovative Smart Grid Technologies—Asia (ISGT Asia); IEEE; Kuala Lumpur.

* cited by examiner

US 11,079,437 B2

BATTERY STATE-OF-HEALTH DETERMINATION UPON CHARGING USING STATE-OF-HEALTH CLASSIFIER

TECHNICAL FIELD

This application relates to a method and system for determining the state of health (SoH) of rechargeable batteries. In particular, it relates to the determination of the SoH based on a rough classification of the SoH, a converged state of charge (SoC) value obtained during charging, and a subsequent, more accurate calculation of the SoH.

BACKGROUND

The main challenges with battery SoH indicator methods are the different varieties of battery types and chemistries, with different rated capacities and nominal voltages. One common method is to use coulomb counting during the charge cycle to obtain full charge capacity. The challenge with this method is when the battery under charge has not been fully discharged prior to charging. Using the voltage method to estimate the initial SoC is not always reliable, particularly for Li ion batteries. In addition batteries with low SoH do not show the same voltage profile as healthy batteries.

SUMMARY OF INVENTION

First, the SoH of the battery is estimated and classified as good, medium or poor. Secondly, the SoC of the battery to be charged is estimated. Bothe these steps occur before charging starts. Then, during the initial stage of charging, the SoC is repeatedly estimated taking into account the SoH classification until it converges to a more reliable value. Upon convergence, the SoH is provided as a percentage, either from the Kalman filter used to determine the SoC or from a later value of the SoC resulting from the supply of a known charge to the battery during continued charging.

In the latter case, the value of the SoC at convergence serves as a first data point. At least one further SoC value that is obtained after convergence, during and/or after the remainder of the charging, serves as a further data point. The amount of charge supplied to the battery is measured between the two data points. The SoH can then be calculated from the charge supplied, the data points and the rated capacity of the battery.

Disclosed herein is a method of determining SoH of a battery comprising the steps of: classifying the battery into one of multiple SoH classifications; estimating an initial value of a SoC of the battery; starting to charge the battery; repeatedly measuring a voltage across terminals of the battery as the battery is charged; repeatedly predicting values of the voltage across the terminals using an extended Kalman filter, wherein the SoH is a state of the extended Kalman filter; repeatedly comparing the predicted values with the measured voltages; determining that a difference between the predicted values and the measured voltages is below a threshold; and obtaining a value of the SoH from the extended Kalman filter.

Also disclosed is a battery charger for determining SoH of a battery comprising: a battery interface that connects to the battery; a user interface; a processor connected to the battery interface and the user interface; and a computer readable memory storing computer readable instructions. When executed by the processor, the instructions cause the battery charger to: classify the battery into one of multiple SoH classifications; estimate an initial value of a SoC of the battery; start to charge the battery; repeatedly measure a voltage across terminals of the battery as the battery is charged; repeatedly predict values of the voltage across the terminals using an extended Kalman filter, wherein the SoH is a state of the extended Kalman filter; repeatedly compare the predicted values with the measured voltages; determine that a difference between the predicted values and the measured voltages is below a threshold; obtain a value of the SoH from the extended Kalman filter; and output the calculated value of the SoH on the user interface.

BRIEF DESCRIPTION OF DRAWINGS

The following drawings illustrate embodiments of the invention, which should not be construed as restricting the scope of the invention in any way.

DESCRIPTION

A. Glossary

Figure 1:
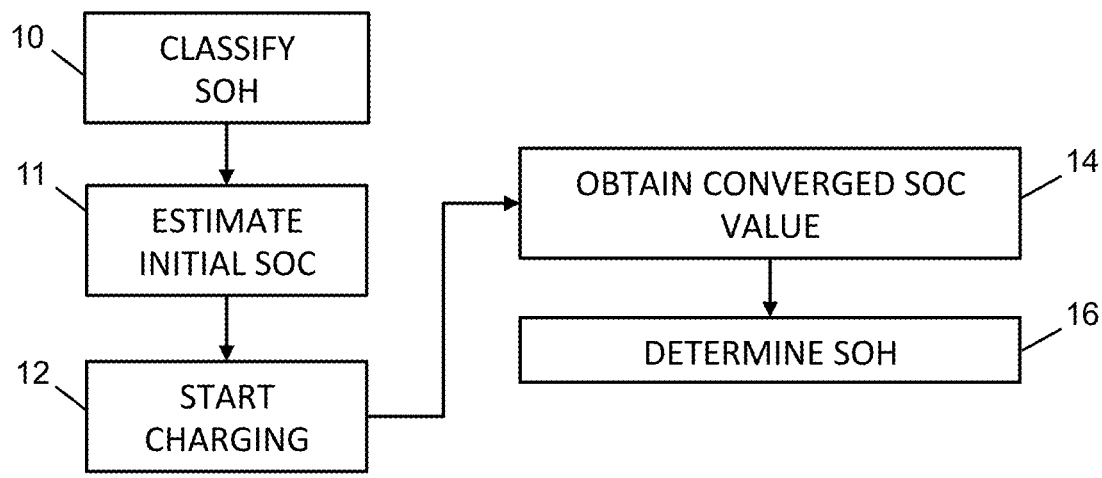
FIG. 1 is a flowchart showing the main steps of the process for determining the SoH of a battery, according to an embodiment of the present invention.

The term "capacity", "rated capacity", "nominal capacity" or "C" refers to the rated maximum charge that a battery can hold when it is new. Capacity is measured in Coulombs, Ah or mAh.

The term "C-rate" refers to the rate of charge or discharge of a battery. It equals the fraction of the battery's capacity that is charged or discharged in one hour, or the multiple of times that the battery would be charged or discharged if charging or discharging continued for an hour.

The term "CC" means constant current.

The term "CV" means constant voltage.

The term "CCCV" means applying a constant current to charge a rechargeable battery until the voltage reaches some limit; after that point, applying a constant voltage to the battery until the charging current drops below a threshold.

The term "EKF" or "filter" refers to an Extended Kalman Filter.

The term "module" can refer to any component in this invention and to any or all of the features of the invention without limitation. A module may be a software, firmware or hardware module.

The term "nominal voltage" refers to the mid-point between the voltage when fully charged and the voltage when fully discharged based on a discharge rate of 0.2 C per hour, where C is the rated capacity of the cell. The term "nominal voltage" may also be referred to as the voltage rating of the battery, or simply the voltage of the battery.

The term "maximum cut-off voltage" refers to the OCV when the battery is fully charged. A battery should not be charged to a voltage higher than its maximum cut-off voltage.

The term "open circuit voltage" (OCV) refers to the voltage across the terminals of a battery without any current being drawn from the battery. Typically, as the SoC of a battery declines, its OCV falls. Also, as a battery's SoH deteriorates, the maximum OCV to which the battery can be charged declines.

The term "processor" is used to refer to any electronic circuit or group of circuits that perform calculations, and may include, for example, single or multicore processors, multiple processors, an ASIC (Application Specific Integrated Circuit), and dedicated circuits implemented, for example, on a reconfigurable device such as an FPGA (Field Programmable Gate Array). The processor performs the steps in the flowcharts, whether they are explicitly described as being executed by the processor or whether the execution thereby is implicit due to the steps being described as performed by code or a module.

The term "recovery period" or "rest period" refers to a duration of time after which a current pulse has been discharged from a battery. During the recovery period, no current is drawn from the battery, i.e. substantially no current is drawn from the battery.

RMS—Root mean square
RMSE—Root mean square error

The term "state of charge" (SoC) is a percentage that refers to the amount of charge available in a rechargeable battery. Typically, the SoC is measured as a percentage, with 100% being fully charged and 0% being either fully discharged to a minimum cut-off voltage or discharged to the point beyond which damage may occur.

The term "state of health" (SoH) is a percentage that refers to the maximum amount of charge a rechargeable battery can presently hold compared to its rated charge, or its maximum charge when new. As the battery ages, and as it is cycled through discharge and charge cycles, the SoH falls. Eventually, the SoH drops so low that the battery becomes unfit for its purpose.

The term "system" when used herein refers to a system for determining the SoH of rechargeable batteries using an initial SoH classification, the system being a subject of the present invention.

B. Overview

Referring to FIG. 1, the main steps of the process for determining the SoH of a battery are shown. In step 10, the SoH of an uncharged or partially charged battery is classified into one of three broad classifications: good, medium and poor. This can be done by applying a pulse of charge to the battery and observing the battery's response. Depending on the response, the SoH can be quickly classified.

In step 11, an estimate is made of the initial SoC of the battery. The battery has a known rated capacity and model. The estimate of the SoC is made using a known voltage method, for example, which involves reading the voltage of the battery and looking up the value of the SoC that it corresponds to. This may be done, for example, by referring to a graph such as the one shown in FIG. 2, in which the OCV (open circuit voltage) of the specific battery model is plotted against its SoC. It is accepted that this type of SoC determination is highly prone to error, which is why it is used only as an estimate.

In step 12, the charging of the battery is started. There are many known techniques for charging a battery that can be employed. In step 14, while charging is in process, the SoC of the battery is repeatedly evaluated. After multiple measurements, the value of the SoC converges to a considerably more accurate estimate than the initial estimate. The converged value of the SoC may be obtained using Kalman filtering, for example, in which the SoC is repeatedly predicted and corrected as the charging proceeds. When the RMS (root mean square) error of a series of measurements of the battery terminal voltage, compared to simulated values of the terminal voltage, is within a predefined tolerance, then the terminal voltage, and hence the SoC, can be considered to have converged. In some embodiments, initial SoC is also one of the state variables and its corrected value is reported at the end of charging, and it is also used for calculating SoH at the end of charging.

In step 16, the SoH is determined or calculated more accurately than the initial classification. In some cases, the SoH is one of the states of the Kalman filter used for determining the SoC, and it is determined by reading its value from the Kalman filter.

Figure 3:
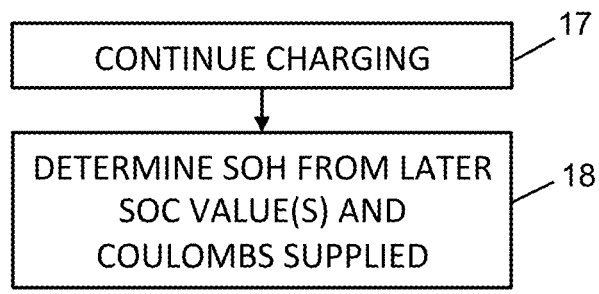
FIG. 3 is a flowchart of alternate steps in the process for determining the SoH of a battery, according to an embodiment of the present invention.

In other cases, instead of determining the SoH at step 16, charging of the battery continues in step 17 of FIG. 3. At a later point in time, in step 18, a second SoC data point is obtained ($SoC_2$), which, for example, may be the SoC when the battery is fully charged, i.e. 100%, or when the battery is has been charged more but not completely. The amount of charge ($Q_{actual}$) the battery takes between the SoC of the two data points, divided by the expected charge that the battery should take if its capacity is equal to its rated capacity, results in the SoH of the battery.

$$SoH = Q_{actual}/Q_{expected} \quad \text{(equation 1)}$$

The expected charge that the battery should take is calculated from its rated capacity C and the first and second SoC data points:

$$Q_{expected} = C(SoC_2 - SoC_e) \quad \text{(equation 2)}$$

It can therefore be seen that the SoH can be calculated either after the battery has been completely charged or when it has been partially charged.

C. Exemplary Embodiments

Figure 2:
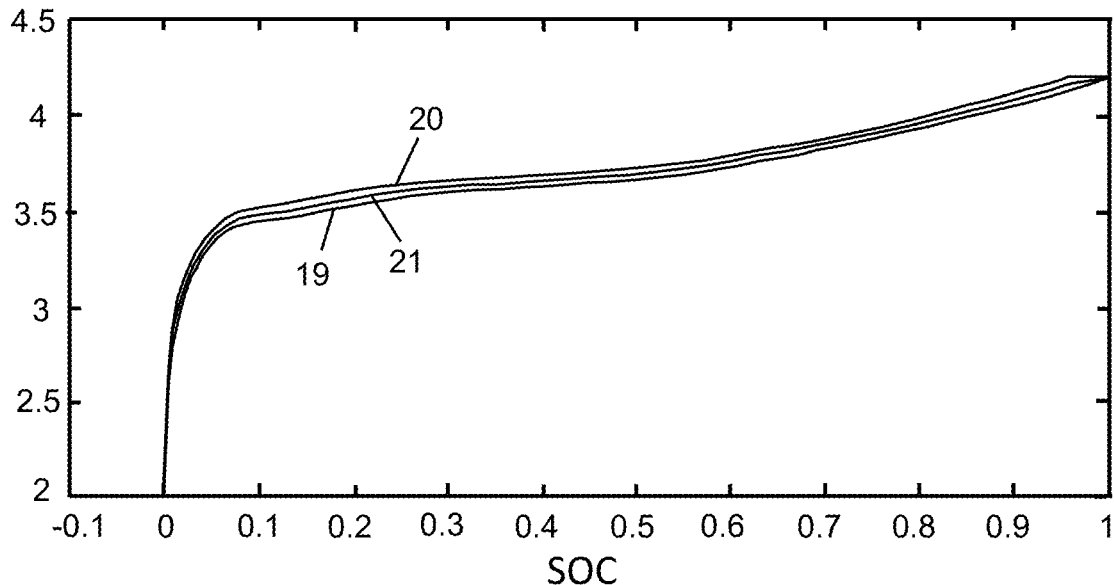
FIG. 2 is a graph of open circuit voltage against SoC for a rechargeable battery.

FIG. 2, which shows the OCV of a rechargeable battery as a function of its SoC, is obtained in the preprocessing steps prior to determining the SoH of a battery during charging. Line 19 is the OCV of the battery, or a battery of identical model, during discharge. Line 20 is the OCV of the battery or identical model during charging. Line 21 is the average of the two lines 19, 20.

Figure 4:
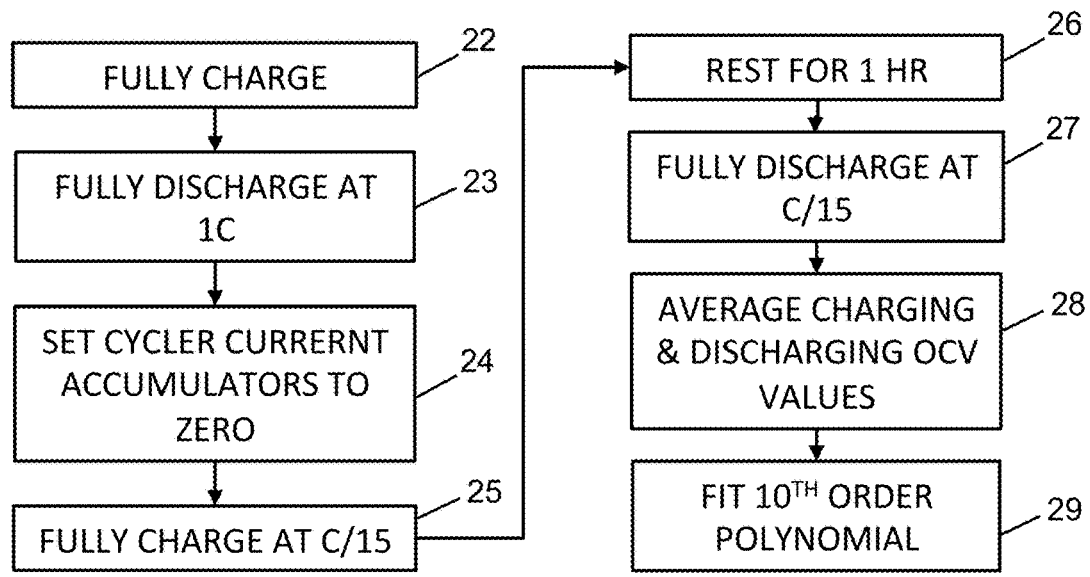
FIG. 4 is a flowchart of a process for obtaining the graph of FIG. 2.

The steps undertaken to obtain line 21 are shown in the flowchart of FIG. 4. In step 22, a new battery of the model in question is fully charged in a CCCV mode. In step 23, the battery is fully discharged in a CC mode with a 1C rate until its voltage hits its minimum voltage. In step 24, all the cycler current accumulators for counting the charge in the battery (integrating current as a function of time) are reset to zero, and the battery is considered to be at a zero SoC.

In step 25, the battery is fully charged slowly, at a C-rate of C/15, in a CCCV mode, while recording the OCV. Charging is not stopped to record the OCV. An alternative method is to charge the battery with the manufacturer recommended C-rate, for a short period of time (e.g. 5 min), stop the charging and record the OCV after the battery voltage has stabilized (e.g. after 15 min rest), and then repeat the charge-stop steps until the battery is fully charged.

In step 26, the battery is then left to relax for one hour. In step 27, the battery is fully discharged at the same C/15 rate, again while recording the OCV. In step 28, the average of data obtained in steps 25 and 27 is calculated. In step 29, a $10^{th}$ order polynomial is fitted to the data of step 28, using a least squares fit. A $10^{th}$ order polynomial has been chosen because a lower order polynomial would be less accurate and if a higher order were used, then extra computational power would be needed without any significant benefit to having the higher accuracy. Using the polynomial, the expected SoC can be determined analytically from a measurement of the OCV during the process for assessing the SoH of the battery upon charging.

The process of FIG. 4 is then repeated twice, once for a battery with medium SoH and once with a battery of poor SoH, so that there are a total of three graphs. By initially performing a broad classification of the SoH, a more appropriate set of parameters can be selected for the Kalman filter and the electrical model used in determining the SoC.

Figure 5:
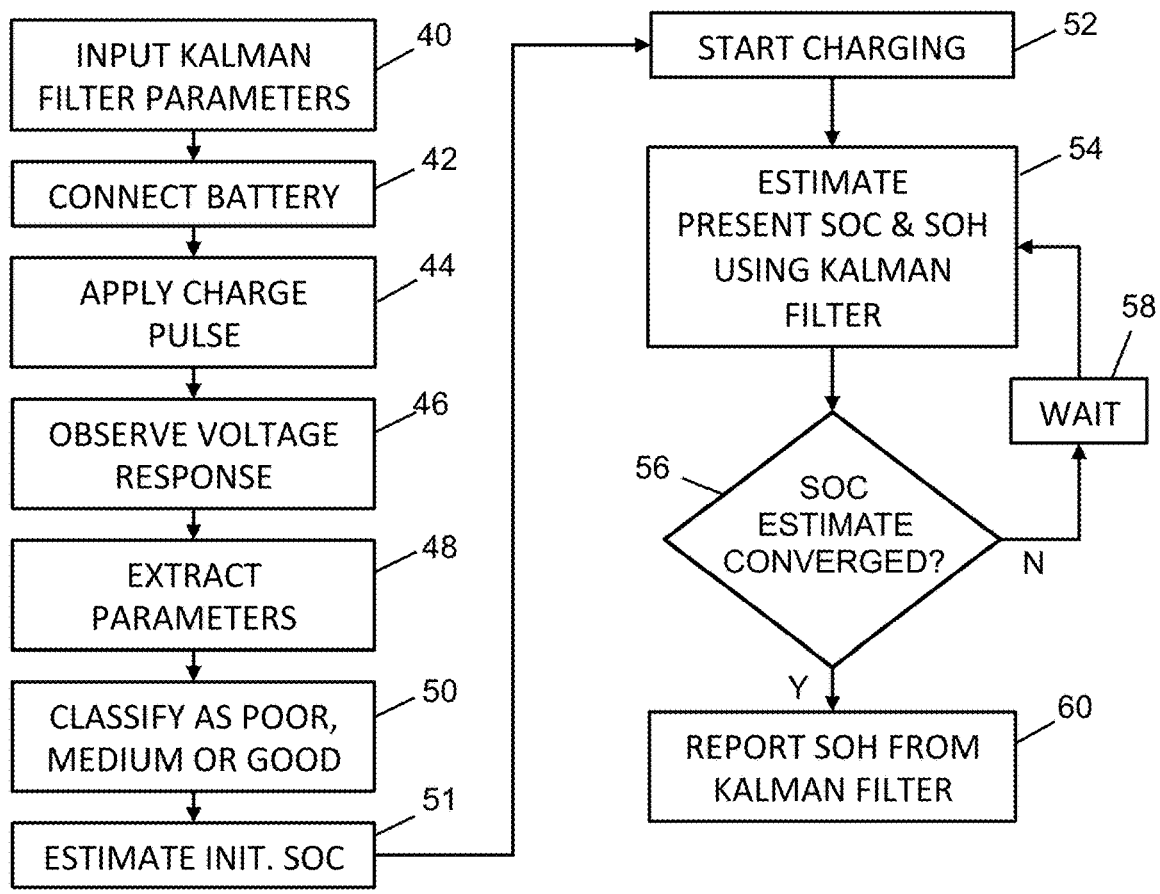
FIG. 5 is a more detailed flowchart of a process for determining the SoH of a battery, in which SoH is a state of the Kalman filter, according to an embodiment of the present invention.

FIG. 5 is a more detailed flowchart of a process for determining the SoH of a battery. In this first embodiment, the battery is fully charged during the process, and the SoH is determined while charging but before charging is complete.

In step 40, various parameters are input into the extended Kalman filter (EKF) that is to be used. The extended Kalman filter needs certain parameters from the battery for the electrical model and measurement. These parameters are obtained beforehand through testing new (or other) batteries of each type and model, and stored in the charger unit (or in the battery adaptor unit that goes with the charger) for specific battery models. These parameters include the graph of FIG. 2 for each broad SoH classification and type of battery to be tested, and the different electrical models.

In step 42, a battery with a known rated capacity C and model is connected to the charger. The user specifies the capacity and model of the battery, unless the charger can automatically detect them.

Figure 6:
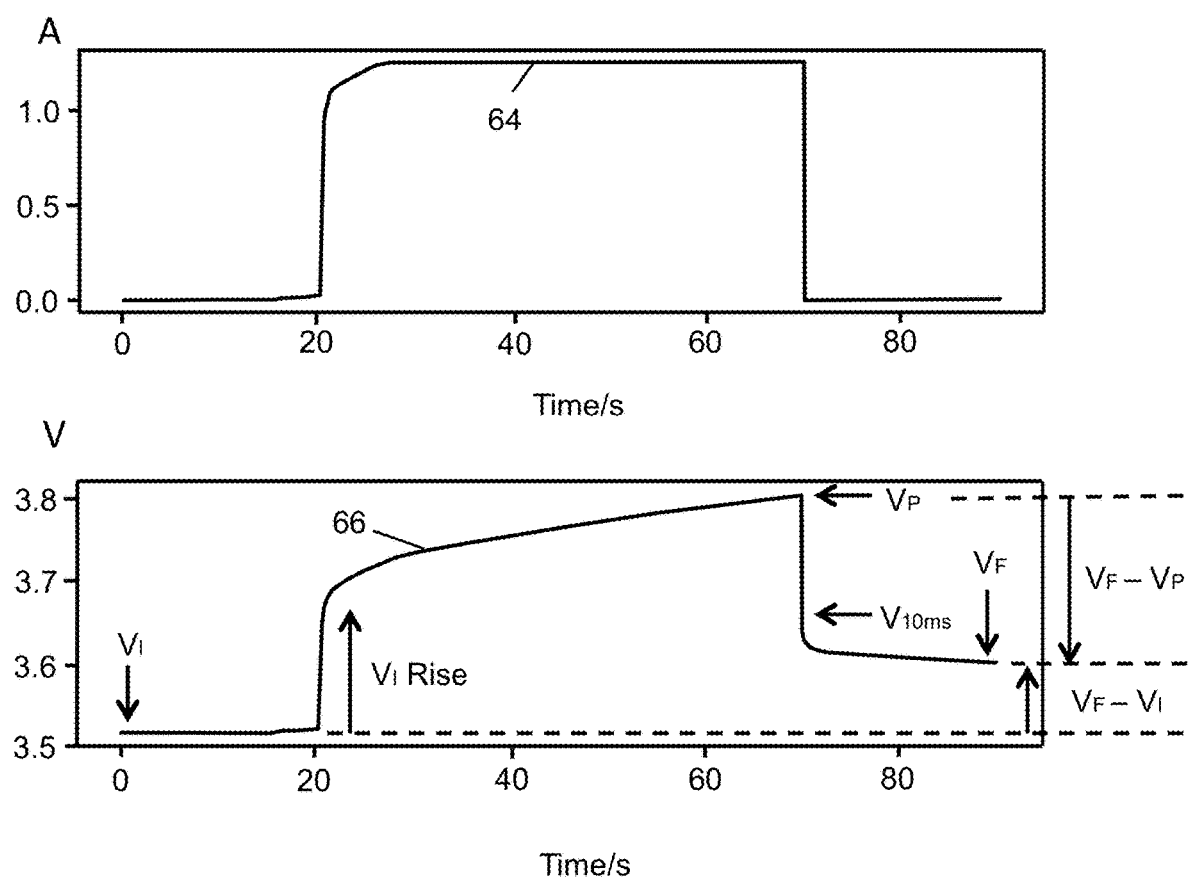
FIG. 6 is an example of a battery's response to a charge pulse.

In step 44, a charge or discharge pulse is applied to the battery. For example, a C/2 current is applied for 1 minute followed by a rest of 2 minutes. In step 46, the voltage response of the battery is observed, e.g. as in the lower portion of FIG. 6, which shows the discharge current pulse 64 above and the corresponding voltage response 66 below. In step 48, various parameters are extracted from the voltage response 66. These parameters include one or more of:

immediate voltage rise ($V_{I\text{-}rise}$);

time constant before reaching the peak, which is the length of time it takes for the response to reach the peak voltage and stay at constant voltage. There is usually a constant voltage after an exponential portion, unless the battery is very poor and takes a long time to reach the peak, which is the case in FIG. 6;

$V_{peak} - V_{initial}$ ($V_P - V_I$);
V after 10 ms rest;
$V_{peak} - V_{10ms}$;
$V_{final}$ (VF);
$V_{final} - V_{initial}$; and
$V_{final} - V_{peak}$.

In step 50, at least 1 of the extracted parameters is used in an algorithm to classify the battery into poor, medium or good SoH. The algorithm is developed using all the parameters obtained from testing multiple batteries of different types and SoH values in a training algorithm that uses machine learning. The training algorithm itself decides what parameters to be used based on their correlation to the SoH class. The algorithm used in the present invention is the output formula of the training algorithm, and may either use simple thresholding or continuing use of a machine learning algorithm. The pulse classifier used in step 50 therefore needs certain parameters for the battery or for similar batteries. The classification can be achieved using the method and system based on that described in US patent application publication 2018/0149708 filed on Nov. 30, 2016, incorporated herein by reference in its entirety.

In step 51, the initial SoC is estimated by, for example, measuring the OCV of the battery and then referring to the graph (e.g. FIG. 2) that corresponds to the classification of the SoH. The SoC associated with the measured OCV is then read from the corresponding graph, or computed analytically using the $10^{th}$ order polynomial.

In step 52, the charger starts charging the battery. In step 54, the present value of the SoC is repeatedly estimated using the extended Kalman filter, while charging is in progress. Charging is not stopped while the measurements are taken. The Kalman filter also estimates the SoH each time the SoC is estimated. The Kalman filter keeps predicting the SoC and SoH and correcting the predictions based on measurement as the charging progresses. The prediction is based on the measurement of the battery terminal voltage. As the battery is being charged, the prediction of the SoC converges to a moving value, but the prediction of SoH converges to a steady state.

In step 56, the system determines whether the measured SoC has converged over the latest set of measurements to a value within a predetermined threshold from the expected value. The root mean squared error (RMSE) for the latest predetermined number of samples is repeatedly calculated and compared to a threshold value, which is set to indicate the convergence:

$$RMSE = \sqrt{\frac{1}{n}\sum_{i=1}^{n}(\hat{y}_i - y_i)^2} \qquad \text{(equation 3)}$$

Here, $\hat{y}$ is the array/list holding the simulated terminal voltages of size n, and y is the array/list holding the measured terminal voltages of size n.

Figure 7:
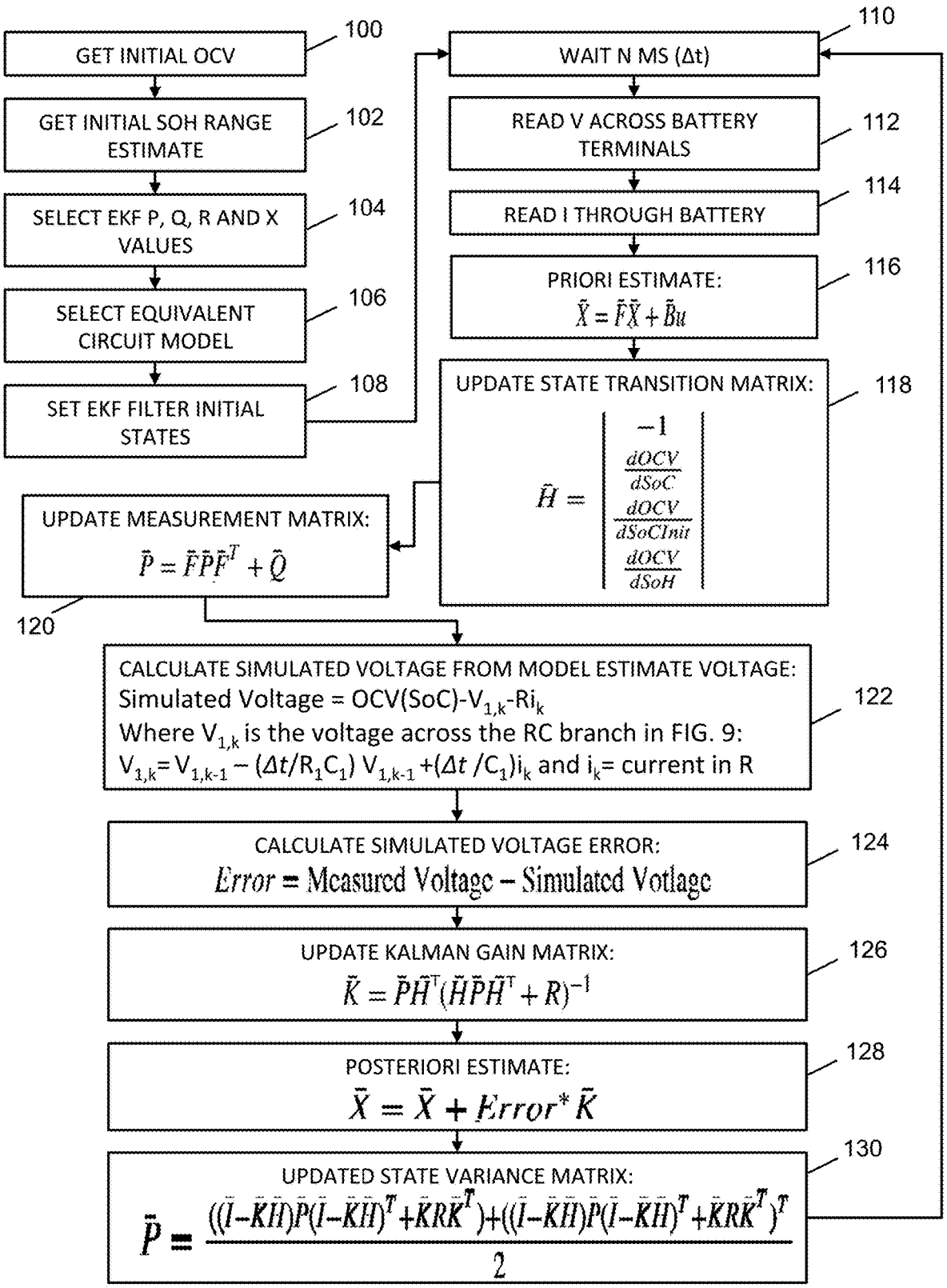
FIG. 7 is a flowchart of the steps the Kalman filter takes, according to an embodiment of the present invention.

Alternatively, the P matrix, which is the covariance of expected error in the EKF states is used to confirm convergence (See FIG. 7 for the Kalman filter process). When all parameter states converge, so do their expected error. The trace of P provides a simple single value, which can be used to confirm convergence, or alternatively a sum of the parameter states could be used for the same purpose.

Alternatively still, the normalized innovation squared (NIS) is used to confirm convergence. The NIS is calculated as follows:

$$\epsilon_v(k) = v(k)^T S(k)^{-1} v(k) \qquad \text{(equation 4)}$$

where S(k) is the innovation covariance and v(k) is the innovation, the difference between measurement and prediction:

$$v(k) = z(k) - \bar{z}(k) \quad \text{(equation 5)}$$

If the error of a filter is consistent with the variances calculated by the filter, the filter is said to be consistent, and hence the state parameter is said to be converged.

Typically, it takes about 5-10 minutes to converge if the time taken to obtain a sample measurement is 200 ms. After each sample is taken, the measured value is fed back into the filter. If, in step 56, it is determined that the SoC has not converged, then the system waits, in step 58, while the battery continues to charge. After a period of waiting, the SoC and SoH are once again estimated by the extended Kalman filter, in step 54. If, in step 56, it is determined that the SoC has converged, then the process moves to step 60 in which the SoH is reported from the Kalman filter. The result is that the SoH is determined before the battery has completely charged.

FIG. 7 shows the steps that relate to the operation of the Kalman filter in step 54 of FIG. 5.

In step 100, the filter obtains the initial OCV, which is used in step 51 to estimate the initial SoC. In step 102, an initial SoH range is obtained, based on the SoH classification into which the battery has been classed. For example, a good SoH is in the range >90%; a medium SoH is in the range 70-90%; and a poor range is <70%.

In step 104, the values for the P, Q, R, and X matrices are selected. In step 106, the equivalent circuit model is selected. Use of the OCV/SoC model for poor batteries along with the RC values of a good battery is adequate. However, in other embodiments, RC parameters can be obtained beforehand for poor and medium batteries. In step 108, the initial states of the filter are set, which include the initial SoH classification and the initial estimate of the SoC.

In step 110, the filter waits N ms, which is the time between each iteration of the filter. In step 112, the voltage across the battery terminals is read, and in step 114, the current through the battery is read. In step 116, the filter makes an a priori estimate of X, where F is the prediction matrix, B is the control matrix and u is the control vector (the current). In step 118, the state transition matrix H is updated. In step 120, the measurement matrix is updated.

In step 122, the simulated voltage is calculated from the electrical circuit model. Specifically, the charge supplied to the battery along with the estimated SoC at the previous iteration are used to predict the SoC, which is then used to determine the OCV from the OCV vs. SoC graph for the battery; the OCV is then used in the electric circuit model with the measured current through the battery to calculate an expected (i.e. simulated) battery terminal voltage. The Kalman filter can be used for both charging and discharging, but it is only used for charging in the present embodiment. The objective is to update the SoC predication on every iteration based on the error between the measured and the simulated terminal voltage, until the error falls below a certain threshold and the SoC is said to be converged.

In step 124, the error in the simulated voltage is calculated. In step 126, the Kalman gain matrix K is updated. In step 128 the a posteriori estimate of X is made. In step 130, the state variance matrix is updated. The process then loops back to step 110.

Figure 8:
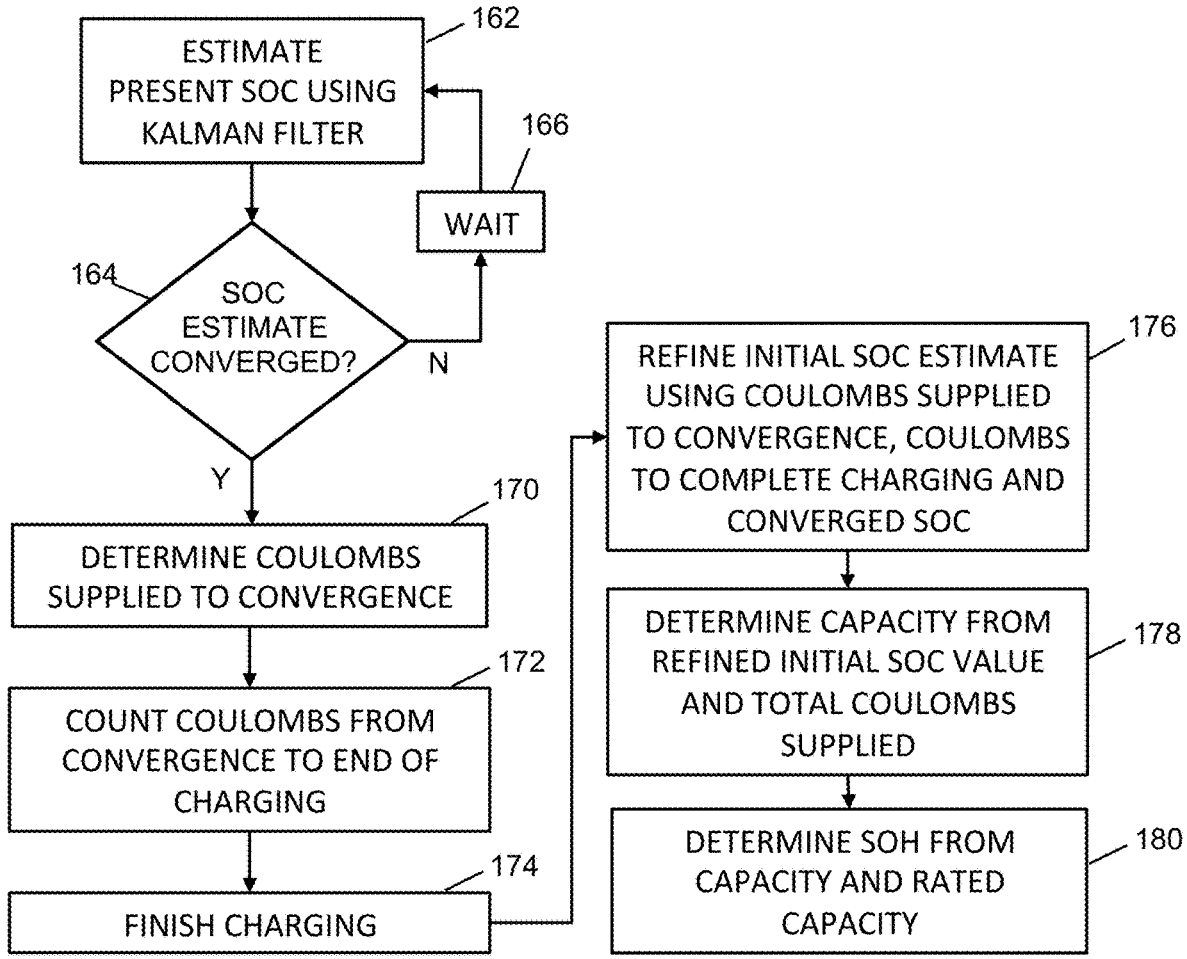
FIG. 8 is a partial flowchart of a process for determining the SoH of a battery using measurements of the SoC, according to an alternate embodiment of the present invention.

A second embodiment is shown in FIG. 8, which shows a partial flowchart for determining the SoH of a battery using a further measurement of the SoC. The process is the same as in FIG. 5 up to and including step 52. However, after the charging has started, the process jumps to step 162 of FIG. 8. In step 162, the present value of the SoC is repeatedly estimated using the extended Kalman filter, while charging is in progress. The SoH is not a state of the Kalman filter in this embodiment, but its initial classification determines which parameters are used in the filter. The Kalman filter keeps predicting the SoC and correcting the prediction based on measurement as the charging progresses. The prediction is based on the measurement of the battery terminal voltage. As the battery is being charged, the prediction changes accordingly. In some embodiments the initial SoC itself is one of the state variables and its value is used at the end of charging along with the coulombs counted during charging to calculate SoH.

In step 164, the system determines whether the measured SoC has converged over the latest set of measurements to a value within a predetermined threshold from the expected value, using a RMSE calculation as above. If, in step 164, it is determined that the SoC has not converged, then the system waits, in step 166, while the battery continues to charge. After a period of waiting, the SoC is once again estimated by the extended Kalman filter, in step 162. If, in step 164, it is determined that the SoC has converged, then the process moves to step 170 in which the number of coulombs that have been supplied to the battery up until this point is determined. This is determined by multiplying the current supplied by the time taken to supply the current, where the current is supplied at a constant rate.

In step 172, the number of coulombs entering the battery as it continues to charge is counted, until charging finishes in step 174.

In step 176, the system then refines the initial SoC estimate based on the increase in SoC from convergence and the relative amounts of charge supplied before and after convergence:

$$SoC_i = SoC_c - (SoC_f - SoC_c)Q_1/Q_2 \quad \text{(equation 6)}$$

Here, $SoC_i$ is the refined value of the initial SoC;
$SoC_c$ is the SoC at the moment of convergence of the SoC;
$SoC_f$ is the final SoC (i.e. 100%);
$(SoC_f - SoC_c)$ is the change in SoH after convergence (as a percentage of the present capacity of the battery);
$Q_1$ is the charge supplied prior to convergence; and
$Q_2$ is the charge supplied from convergence to the end of charging.

In step 178, the present or actual capacity $C_{actual}$ of the battery is calculated from the refined initial SoC value and the total charge supplied:

$$C_{actual} = Q_i + Q_1 + Q_2 \quad \text{(equation 7)}$$

$$Q_i = Q_2 \times SoC_i/(SoC_f - SoC_c) \quad \text{(equation 8)}$$

where $Q_i$ is the initial charge stored in the battery.

In step 180, the system then determines the SoH of the battery:

$$SoH = C_{actual}/C \quad \text{(equation 9)}$$

Instead, equations 1 and 2 can be used to calculate the SoH, where $Q_{actual} = Q_2$ and $SoC_2 = SoC_f$.

In a third embodiment, the initial SoC does not need to be refined. Instead, the converged SoC and the final SoC are used:

$$C_{actual} = Q_2 \times SOC_f/(SOC_f - SOC_c) \quad \text{(equation 10)}$$

The SoH is then determined as per equation 9. Instead, equations 1 can be used to calculate the SoH, where $Q_{actual} = (Q_1 + Q_2)$ and $Q_{expected} = C(SoC_2 - SoC_i)$.

In further embodiments, the charging of the battery is partially or fully completed and a linear fit of the coulombs supplied versus measured SoC is used for the SoH determination. The method is described in co-pending U.S. patent application Ser. No. 16/211,995 entitled "BATTERY STATE-OF-HEALTH DETERMINATION UPON CHARGING", incorporated herein by reference in its entirety.

Figure 9:
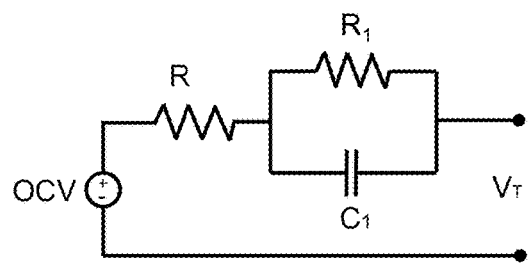
FIG. 9 is an electrical circuit model of a rechargeable battery.

FIG. 9 is an electrical circuit model of a rechargeable battery (Li-ion cell), which is used in the Extended Kalman filter. The values of R, $R_1$, and $C_1$ are determined using a particle swam calculation, for example.

D. Exemplary System

Figure 10:
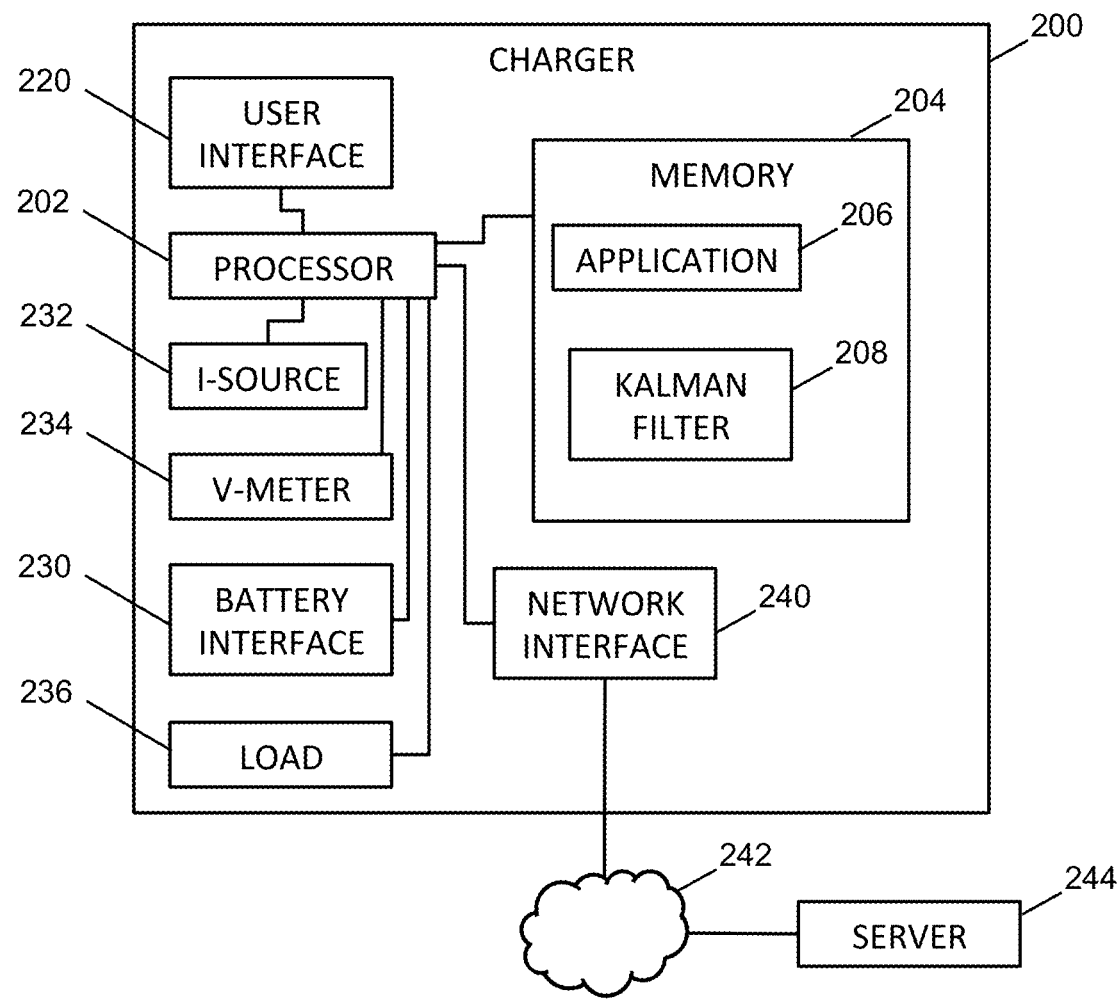
FIG. 10 is a schematic block diagram of a battery charger, according to an embodiment of the present invention.

Referring to FIG. 10, an exemplary system of the battery charger 200 that assesses SoH is shown. The charger 200 include a processor 202 operably connected to a computer-readable memory 204 in which is stored a sequence of computer readable instructions in the form of an application 206. The memory also stores the Kalman filter 208. A user interface 220 allows users to input the details concerning a battery, such as the battery's capacity and/or model number. The user interface 220 also includes an output display, which indicates the SoH as determined by the charger 200.

There is an interface 230 to the battery, which may be a battery adapter. The battery adapter in some embodiments is removable from the charger. The battery adapter in some embodiments stores data specific to the batteries to which it is adapted, such as the Kalman filter, the electrical model, the rated capacity of the battery and the OCV-SoC curve(s).

The charger 200 also includes a current source 232 for charging the battery and a voltmeter 234 for measuring the voltage across the battery terminals during the charging process. The charger has a load module 236 for discharging the battery, for example if a discharge current pulse is required to be drawn from the battery when classifying its SoH.

The battery charger 200 optionally includes a network interface 240 through which the charger is connected via a network 242 (e.g. internet and/or cellular network) to a server 244. The server in some embodiments stores data specific to the batteries to be charged and for which the SoH is to be determined, such as the Kalman filter, the electrical model, the rated capacity of the battery and the OCV-SoC curve(s).

E. Variations

The present embodiments include the best presently contemplated mode of carrying out the subject matter disclosed and claimed herein, however, other embodiments are possible.

If the battery being charged does not have its parameters stored, then a self-learning mode can be added as an option to the charger 200. In this, a battery is fully charged and discharged at a C/15 or slower rate and the charger automatically fits a polynomial to the OCV-SoC curve. Subsequently, a C/2 charge or any standard charge rate used by the charger is performed, and the resulting data is fitted to the electrical circuit model. These parameters are saved to the adaptor for that particular battery model and can be used in the future as well.

In some embodiments, the electrical circuit model used may be of an order different to the example given, e.g. $2^{nd}$ or $3^{rd}$ order.

In some embodiments, for simplicity instead of an electrical circuit model, a curve can be fitted to a portion of the charge profile (e.g. in constant current mode or constant voltage mode), and the Kalman filter only operates during a corresponding portion of the charging.

In some embodiments, the parameter relating to SoC of the battery is computed based on the battery's terminal voltage and battery electrical circuit model, wherein a non-linear estimation method other than extended Kalman filtering is employed to correct the SoC prediction during the charging process.

In some embodiments, the electrical circuit model used in the estimation algorithm, such as Extended Kalman Filter, is obtained through preprocessing of the data relating to the battery's SoC/OCV in conjunction with the electrical circuit model.

In some embodiments, the data relating to the battery's SoC/OCV and/or the electrical circuit model parameters of both new and aged batteries (at various SoHs) are used during the Kalman filtering and the filter decides the appropriate model through an interacting multiple model (IMM) algorithm.

In some embodiments, a polynomial other than $10^{th}$ order is fitted to the average of SoC/OCV of the charge and discharge graphs.

In some embodiments, the hysteresis effects of the SoC/OCV of charge and discharge graph are considered in the OCV model of the electrical circuit model.

In some embodiments, a fitting algorithm such as the particle-swarm method is used to extract parameters from the electrical circuit model.

In some embodiments, the overall charging time is used to calculate the battery remaining capacity (SoH), wherein the time during which the battery had reached its initial SoC is also calculated using the estimation algorithm and considered in the SoH calculation.

In some embodiments, a signal is applied to the battery in the form of pulse or continuous wave after charging.

In some embodiments, the battery response from the excitation signal is evaluated through machine learning algorithms in order to classify the SoH.

In some embodiments, the parameters obtained from the excitation signal applied prior to charging or after charging are normalized based on the battery rated parameters such as rated capacity.

In some embodiments, the parameter relating to classified SoH is employed to adjust the parameters of the estimation method for accurate estimation of SoH within full or partial charging.

In some embodiments, the parameter relating to classified SoH is employed to adjust the battery electrical circuit model for accurate estimation of SoH.

In some embodiments, the parameter relating to the battery charging period is obtained only during the constant current mode, and the estimation algorithm only applies during constant current period.

In some embodiments, a simple polynomial fit is used instead of an electrical circuit model to fit to the battery charging profile in a constant current mode.

In some embodiments, the parameter relating to the battery charging period is obtained during the complete charge cycle, and the estimation algorithm applies during the full charging process.

In some embodiments, the parameter relating to SoH is reported immediately after the SoC value is correctly identified through the estimation method.

In some embodiments, the parameter relating to the battery temperature is used to compensate for the heat loss during charging.

In some embodiments, the parameter relating to the battery SoH is obtained only during the constant voltage mode.

One embodiment is a diagnostic charger unit for charging batteries and reporting the SoC and SoH of the battery during and at the end of charging process, wherein the parameters relating to the battery diagnostic method, including electrical circuit models and nonlinear estimation, are obtained through testing batteries, preprocessed, and then utilized during the charging process.

In some embodiments, the parameters relating to the battery and the filter are stored in the battery adaptor connected to the charger unit.

In some embodiments, the parameters relating to the battery and the filter are stored in a cloud-based server and obtained through network connectivity.

Once the SoC of the battery is established using the estimation method during the charge process, it can be deployed to tune or control an ultra-fast charging procedure for the battery. Ultra fast charging protocols usually involve charging fast up until a certain SoC and then either continue slowly or stop. The present invention helps to find the actual SoC of the battery so that the charger knows when it reaches the limit of the fast charging.

The SoH determination during ultra-fast charging could be used to evaluate if the battery is suitable for continued ultra-fast charging, or further ultra-fast charging procedures. If the battery's SoH is below a certain threshold, then it is not safe to charge it fast anymore as it speeds up the aging process. The present invention provides the SoH of the battery every time it is charged and can therefore evaluate whether the SoH has fallen below the safe threshold for fast charging.

It is possible to input parameters into the Kalman filter for just new batteries, and extrapolate the parameters of poor and medium SoH batteries from the new ones. This will be done through mapping to the profiles of other pre-tested batteries. For instance, a battery with 50% SoH takes half the time to charge compared to a new battery. So, the charge profile will be shrunk in the x-axis, but in the y-axis it is not obvious how it should be scaled. A study on Li-ion batteries with different SoHs provides a predication model for the charge profile of batteries at different SoHs. This also applies to the circuit model parameters for poor versus good batteries. A database of the study's results shows a trend in the model parameters with SoH.

One embodiment is a method and an apparatus for a charger equipped with a battery health monitoring system. The battery health monitoring method comprises analyzing the battery electrical and optionally thermal information during charging to evaluate the battery state of health. The apparatus comprises a battery charger and is configured to charge the battery and obtain the battery electrical and thermal information. In one embodiment the battery information is obtained prior and during charging. In some embodiments the apparatus comprises additional electronics, wherein the battery discharge response and/or small signal frequency response is extracted from the battery and employed to evaluate the condition (i.e. poor, medium or good SoH) of the battery.

Thermal information relating to the battery may be included for cases where the battery heats up during charging. Depending on the temperature, this will trigger an adjustment to the parameters used. The battery charger is configured to obtain the battery's thermal information.

Another embodiment is a method for evaluating the condition of a battery during charging, the method comprising: measuring the battery voltage, and temperature prior to charging; recording the battery current, voltage and time during at least part of the charging period; applying estimation algorithm during the charging process, computing a measure of a condition of the battery based on acquired parameters wherein the first parameter relates to the battery initial SoC; and a second parameter comprises either the duration of charging period, or directly relates to SoH.

In general, unless otherwise indicated, singular elements may be in the plural and vice versa with no loss of generality. The use of the masculine can refer to masculine, feminine or both.

Throughout the description, specific details have been set forth in order to provide a more thorough understanding of the invention. However, the invention may be practiced without these particulars. In other instances, well known elements have not been shown or described in detail and repetitions of steps and features have been omitted to avoid unnecessarily obscuring the invention. Accordingly, the specification and drawings are to be regarded in an illustrative, rather than a restrictive, sense.

The detailed description has been presented partly in terms of methods or processes, symbolic representations of operations, functionalities and features of the invention. These method descriptions and representations are the means used by those skilled in the art to most effectively convey the substance of their work to others skilled in the art. A software implemented method or process is here, and generally, understood to be a self-consistent sequence of steps leading to a desired result. These steps require physical manipulations of physical quantities. Often, but not necessarily, these quantities take the form of electrical or magnetic signals or values capable of being stored, transferred, combined, compared, and otherwise manipulated. It will be further appreciated that the line between hardware and software is not always sharp, it being understood by those skilled in the art that the software implemented processes described herein may be embodied in hardware, firmware, software, or any combination thereof. Such processes may be controlled by coded instructions such as microcode and/or by stored programming instructions in one or more tangible or non-transient media readable by a computer or processor. The code modules may be stored in any computer storage system or device, such as hard disk drives, optical drives, solid-state memories, etc. The modules may alternatively be embodied partly or wholly in specialized computer hardware, such as ASIC or FPGA circuitry.

It will be clear to one having skill in the art that further variations to the specific details disclosed herein can be made, resulting in other embodiments that are within the scope of the invention disclosed. Steps in the flowcharts may be performed in a different order, other steps may be added, or one or more steps may be removed without altering the main function of the system. Steps may be made to occur in parallel. Flowcharts from different figures may be combined in different ways. Modules may be divided into constituent modules or combined into larger modules. All parameters, factors, thresholds and configurations described herein are examples only and actual values of such depend on the specific embodiment. Accordingly, the scope of the invention is to be construed in accordance with the substance defined by the following claims.

The invention claimed is:

1. A method of determining state of health (SoH) of a battery comprising the steps of:
    classifying the battery into one of multiple SoH classifications;
    estimating an initial value of a state of charge (SoC) of the battery;
    starting to charge the battery;
    repeatedly measuring a voltage across terminals of the battery as the battery is charged;
    repeatedly predicting values of the voltage across the terminals using an extended Kalman filter, wherein the SoH is a state of the extended Kalman filter;
    repeatedly comparing the predicted values with the measured voltages;
    determining that a difference between the predicted values and the measured voltages is below a threshold;
    obtaining a value of the SoH from the extended Kalman filter.

2. The method of claim 1 comprising obtaining a converged value ($SoC_C$) of the SoC from the repeated measurements, wherein the $SoC_C$ is obtained when said difference is below the threshold.

3. The method of claim 1 wherein classifying the battery comprises:
    applying a discharging or charging current pulse to the battery; and
    measuring a voltage response of the battery to the pulse;
    wherein the classification of the battery depends on the voltage response.

4. The method of claim 1, wherein the classifications are good (SoH>90%), medium (SoH 70-90%) and poor (SoH<70%).

5. The method of claim 1, wherein the battery is fully discharged when the initial value of the SoC is estimated.

6. The method of claim 1, wherein estimating the initial value of the SoC comprises:
    measuring an open circuit voltage (OCV) of the battery to result in value V; and
    using V to determine the initial value by accessing a relationship between the OCV and SoC, the relationship being specific to the classification of the battery.

7. The method of claim 6, wherein the relationship is defined by a 10th order polynomial.

8. The method of claim 7, wherein the 10th order polynomial represents an average of OCV and SoC data measured during charging and discharging the battery or another battery that is comparable to the battery.

9. The method of claim 1, comprising continuing to charge the battery after obtaining the value of the SoH.

10. The method of claim 1, wherein the voltage across the terminals is predicted using an electric circuit model of the battery, a current supplied to the battery and a 10th order polynomial relationship between the OCV and SoC.

11. The method of claim 10, comprising:
    measuring a temperature of the battery; and
    adjusting a parameter of the electrical circuit model in response to the temperature.

12. The method of claim 1, wherein the difference is a root mean square difference of multiple sequential comparisons of the predicted values and the measured values.

13. A battery charger for determining state of health (SoH) of a battery comprising:
    a battery interface that connects to the battery;
    a user interface;
    a processor connected to the battery interface and the user interface;
    a computer readable memory storing computer readable instructions, which, when executed by the processor, cause the battery charger to:
        classify the battery into one of multiple SoH classifications;
        estimate an initial value of a state of charge (SoC) of the battery;
        start to charge the battery;
        repeatedly measure a voltage across terminals of the battery as the battery is charged;
        repeatedly predict values of the voltage across the terminals using an extended Kalman filter, wherein the SoH is a state of the extended Kalman filter;
        repeatedly compare the predicted values with the measured voltages;
        determine that a difference between the predicted values and the measured voltages is below a threshold;
        obtain a value of the SoH from the extended Kalman filter; and
        output the calculated value of the SoH on the user interface.

14. The battery charger of claim 13, wherein the battery interface is a battery adapter and the extended Kalman filter is stored in the battery adapter.

15. The battery charger of claim 13, further comprising an interface to an internet-based server, wherein the extended Kalman filter is stored on the server.

16. The battery charger of claim 13, configured to obtain a converged value ($SoC_C$) of the SoC from the repeated measurements, wherein the $SoC_C$ is obtained when said difference is below the threshold.

17. The battery charger of claim 13, wherein the battery charger classifies the battery by:
    applying a discharging or charging current pulse to the battery; and
    measuring a voltage response of the battery to the pulse;
    wherein the classification of the battery depends on the voltage response.

18. The battery charger of claim 13, wherein the battery charger estimates the initial value of the SoC by:
    measuring an open circuit voltage (OCV) of the battery to result in value V; and
    using V to determine the initial value by accessing a 10th order polynomial relationship between the OCV and SoC, the relationship being specific to the classification of the battery.

19. The battery charger of claim 13, wherein the extended Kalman filter includes an electric circuit model of the battery.

20. The battery charger of claim 13, wherein the battery charger is an ultra-fast charger and configured to control a rate of charging using the value of the SoH obtained during charging.

* * * * *